Figure 1:
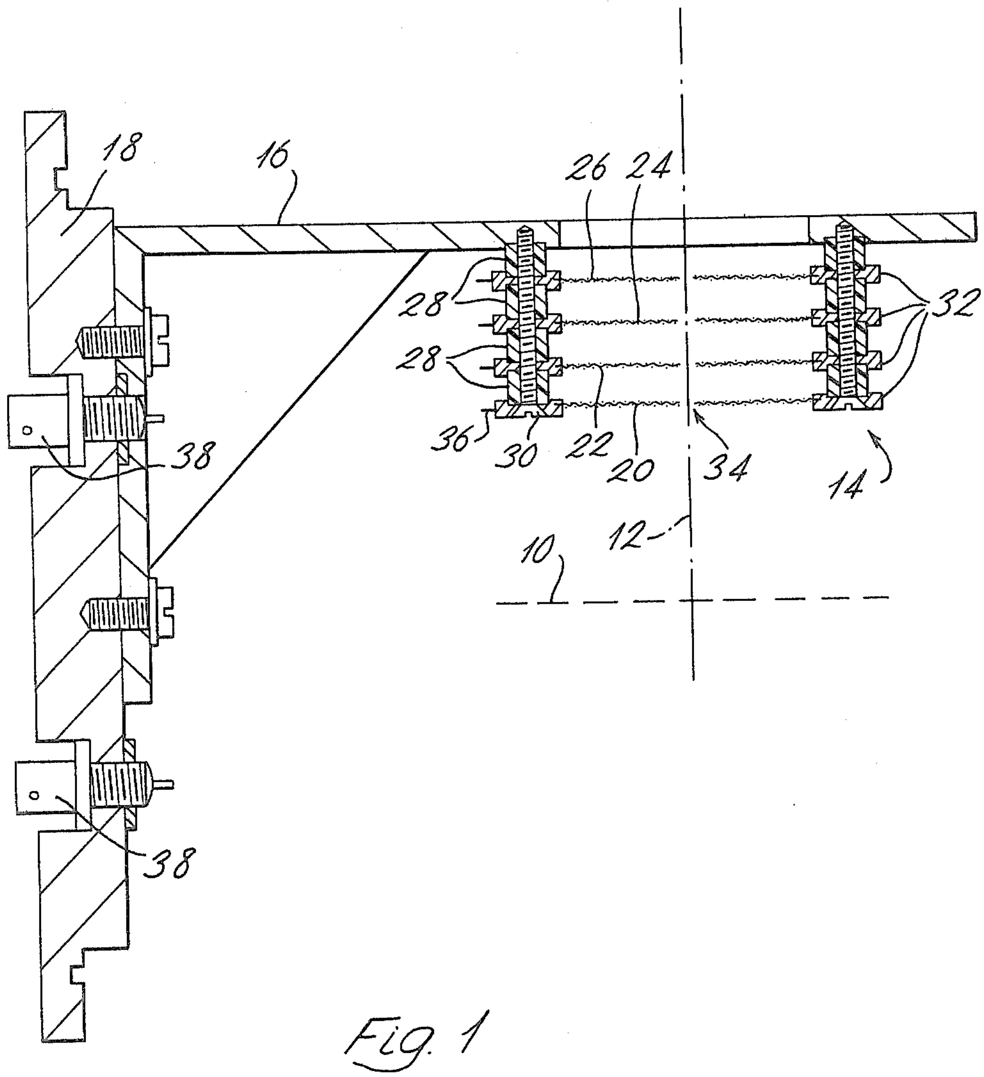

United States Patent [19]

Gopinathan

[11] 4,246,479

[45] Jan. 20, 1981

[54] ELECTROSTATIC ENERGY ANALYSIS

[75] Inventor: Kannampuzha G. Gopinathan, Bangor, Wales

[73] Assignee: National Research Development Corporation, London, England

[21] Appl. No.: 8,691

[22] Filed: Jan. 30, 1979

[30] Foreign Application Priority Data

Feb. 20, 1978 [GB] United Kingdom ............... 06663/78

[51] Int. Cl.³ ...................... H01J 40/00; G01N 23/00

[52] U.S. Cl. .................................... 250/305; 250/310; 250/397

[58] Field of Search ............... 250/305, 306, 310, 311, 250/396, 397, 398

[56] References Cited

U.S. PATENT DOCUMENTS

| | | | |
|---|---|---|---|
| 3,731,096 | 5/1973 | Carter | 250/305 |
| 3,760,180 | 9/1973 | Weber | 250/305 |
| 3,805,068 | 4/1974 | Lee | 250/305 |
| 3,896,308 | 7/1975 | Venables et al. | 250/305 |

FOREIGN PATENT DOCUMENTS 1246744 9/1971 United Kingdom .

OTHER PUBLICATIONS

"Energy Distribution of Thermally Stimulated Exoelectrons by Means of a Retarding Potential Difference Method", Brunsmann et al., *Phys. Stat. Sol.* (a), 26, 1974, pp. K123-K125, 250-305.

"The use and limitations of an electrostatic analyzer for time resolving an electron beam distribution function", Mix et al., Rev. Sci. Instrum., vol. 44, No. 12, Dec. 1973, pp. 1703-1708, 250-305.

*Primary Examiner*—Bruce C. Anderson

*Attorney, Agent, or Firm*—Cushman, Darby & Cushman

[57] ABSTRACT

An element for the retarding field analysis of the energy distribution of electrons is constructed from three or more similar planar grids superimposed in parallel planes. The element is arranged for rigid location with respect to the beam axis of a scanning electron microscope so that the beam passes through aligned apertures in the grids and so that secondary electrons produced from a specimen are collected by the element. In use in the electron microscope the potential of the retarding grid is automatically maintained at a level such that the ratio of electron collection at high and low energies is held constant. The potential so determined can be related to the potential of the surface at the point of origin of the electrons.

7 Claims, 2 Drawing Figures

18 16 26 24 28 28 32 38 36 30 22 20 34 14 10 12 38

ELECTROSTATIC ENERGY ANALYSIS

The invention relates to electrostatic energy analysis and particularly to apparatus for studying the energy distribution of streams of low-energy secondary electrons such as are generated from specimens in electron-beam probe instruments.

It is a known principle to employ a retarding field technique to discriminate between electrons of different energies in a stream and to detect a change in the distribution of energies. In the use of a scanning electron microscope (SEM) to study the surface of a semiconductor device, for example, such a change in the energy distribution of the secondary electron yield arises from a change in the potential of the emission point on the surface. The variation in potential over the surface can therefore be determined by a retarding field analysis.

In the recent development of the technique the necessary electrodes for electron retardation and collection have been constructed as hemispherical grids arranged concentrically about the emission region of the specimen. Very limited space is however available between the objective lens and the specimen stage of an SEM and the form of the specimen itself becomes restricted. Further difficulties arise in the operation of the associated measurement and control circuits.

According to one aspect of the invention there is provided apparatus for electrostatic energy analysis in an electron-beam probe instrument, the apparatus comprising a retarding-field analyzer element having at least three similar planar grids superimposed in parallel planes each grid being pierced to enable an electron beam to pass unobstructed through the element on a common axis perpendicular to the plane of each grid and having independent means for external electrical connection, and means enabling the element to be rigidly located with respect to the beam axis of the instrument above the specimen stage of the instrument.

Preferably, each grid is equally spaced from each adjacent grid in order that the associated values of capacitance shall be equal.

Preferably each grid has a high value of optical transmission (for example in the region of 80%) such that high-energy electrons are readily transmitted.

In one mode of operation of an instrument incorporating the retarding-field analyzer element in which a stream of secondary electrons is generated by the impact of an electron beam on a specimen, the grids being numbered according to their proximity to the specimen, the first grid, nearest to the specimen, is maintained at a positive potential, a second grid is maintained at a negative potential and a third grid is maintained at a positive potential similar to that of the first grid, the currents arising from the collection of secondary electrons from the specimen by the first and third grids being measured continuously and the potential of the second grid being continuously adjusted to maintain a constant ratio between the measured values of current. The potential of the secondary electron emitting region of the specimen may be derived from such measurements of the second grid potential and the current ratio for the first and second grids.

Preferably, the element includes a fourth grid effective when maintained at a negative potential to repel stray secondary electrons.

The element may include a further grid between the second grid and one of the adjacent grids effective when the element is used for retarding field analysis and the further grid is maintained at earth potential, to reduce capacitive coupling between the associated circuits.

The element may further include electron multiplier means, preferably of the channel type, at the input face of the first grid.

According to a further aspect of the invention, an electron-beam probe instrument includes means for producing an axial electron beam, mounting means to enable a desired region of a specimen to be exposed to the electron beam whereby secondary electrons are produced and a retarding field analyzer element in accordance with said one aspect of the invention disposed with respect to the axis of the instrument to enable the energy distribution of the secondary electrons to be determined.

For comparison with the retarding field analyzer element of the invention, of which the planar structure is an essential feature, a previously known structure employed four concentric hemispherical grids. Such a design is attractive theoretically, since the hemispherical geometry produces a radially uniform field at the specimen. Thus, in addition to providing a large collection angle for the secondary electrons, the efficiency of collection is independent of the potential of the emission point. In practice, the hemispherical form is difficult to construct and to handle and because of the limited space which is available for the specimen within the diameter of the inner grid, many subjects of interest cannot be studied. Modern large scale integrated circuits, for example, are mounted on bases which are too large to be accommodated. A further difficulty arises in operation because, for equally spaced hemispherical grids, the capacitance between the retarding grid and the low-energy collector (inner grid) is different from that between the retarding grid and the higher energy collector (third grid). A feedback loop is used to maintain a fixed ratio of collector currents, but becomes unstable in the presence of positive feedback through the unbalanced capacitance.

Figure 2:
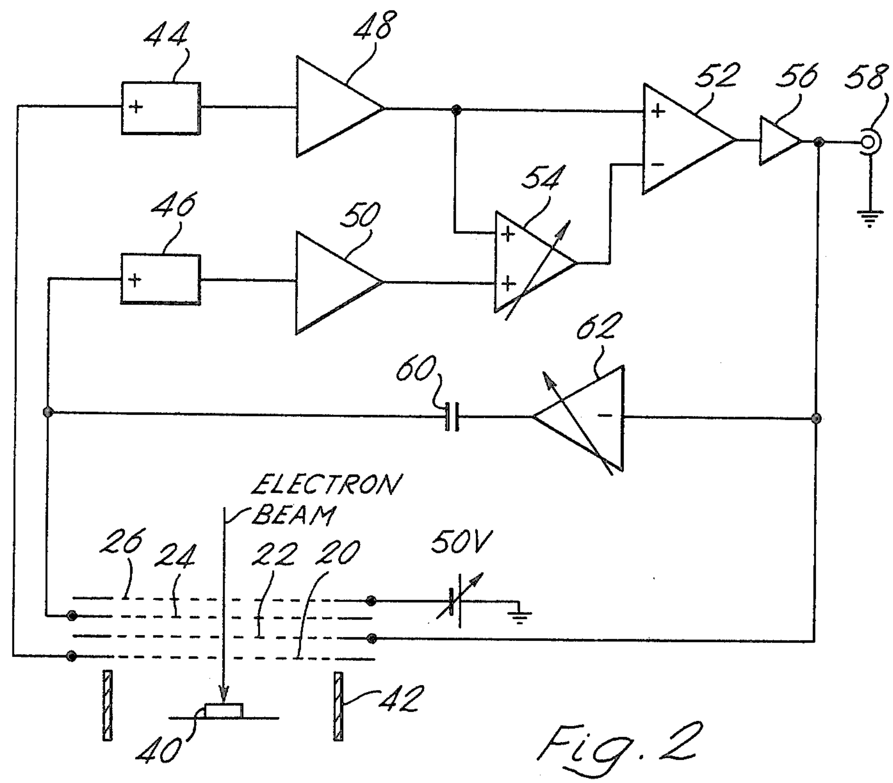

An embodiment of the invention will now be described with reference to the accompanying drawings in which:

FIG. 1 represents diagrammatically a retarding field analyzer element in accordance with the invention; and FIG. 2 illustrates the incorporation of the element of FIG. 1 in a measurement circuit.

With reference to FIG. 1, in the specimen chamber of a scanning electron microscope (not shown) a specimen stage may be adjusted in a horizontal plane 10 to align a desired region of a specimen with the electron optical axis 12. A retarding field analyzer element 14 is mounted by a bracket 16 from a blank plate 18 in a side port of the specimen chamber so that the axis 12 passes centrally through the element 14. The structure of element 14 comprises a stack of planar grids 20, 22, 24, 26 equally spaced apart from each other in parallel planes by spacers 28 of insulating material, the stack being suspended horizontally from a ring-shaped portion of bracket 16 by nylon screws 30. Each grid 20 to 26 comprises a sheet of metallic mesh mounted under tension on a frame 32. The material of the mesh must be non-magnetic. A square mesh of stainless steel wire woven at a pitch of 250 $\mu$m has been used and electroformed copper, for example, would be equally suitable. A wire diameter of one-tenth of the pitch results in a desirably high optical transmission of approximately 80%; if the wire thickness is doubled the transmission is reduced to 64% and preferably any lower value would be avoided. The material of the frame 32 and bracket 16 must similarly be non-magnetic and a suitable grade of brass is convenient. Collinear holes 34 through the meshes are required to pass the electron beam on axis 12 and can be produced with clean edges free from sharp points by means of spark erosion. A pin 36 is attached to each frame 32 for electrical connection to an external circuit via a respective lead-through 38 in blank plate 18.

Referring to FIG. 2, the element 14 is shown connected to a schematic measurement circuit. Physically the components of the circuit are mounted on the outside of the blank plate 18. In operation a specimen 40 is exposed to an electron beam on axis 12 and secondary electrons are produced with a cosine distribution from the normal to the surface. Provided the spacing between the specimen 40 and the nearest grid 20 is not large compared with the diameter of the grid substantially the whole of the secondary electron stream is attracted towards grid 20 which is maintained at a positive potential with respect to specimen 40. An earth plane 42 encircling the specimen mount will further improve the effectiveness of the extraction field.

The manner in which measurements are made is in principle known from the work on hemispherical analyzer elements and will be only briefly described. The positive potential for grid 20 is supplied by a battery 44 and grid 24 is similarly supplied by a battery 46. The potential of the intermediate grid 22 is held negative to perform the retarding function so that low energy electrons are repelled for collection at grid 20 while those of higher energy pass grid 22 to be collected at grid 24. Back scattered electrons of high energy have a high probability of passing through all the meshes and enable an image of the specimen to be derived in the conventional way from a detector such as the Thornley-Everhart detector (not shown). The fourth grid 26 is also maintained at a negative potential and serves to repel stray electrons which might otherwise enter the analyzer element 14 from the column of the SEM. The purpose of the control circuit is to maintain the current collected by grid 20 in a fixed ratio to the current collected by grid 24 (or to the instantaneous sum of the currents) and this is achieved by automatic control of the potential of the retarding grid 22. The current at grid 20 is amplified by an electrometer 48 and the current at grid 24 is amplified by an electrometer 50. The first value is compared in a difference amplifier 52 with the sum of the values derived from a summing amplifier 54. The output from amplifier 52 is then amplified in amplifier 56 and fed back to retarding grid 22. The selected value of current ratio is determined by the setting of amplifier 54 so that the analyzer operates in a linear part of the energy distribution curve. The value of feed back voltage from amplifier 56 can then be read at an output 58 as a measure of the emission-point potential. For an emission-point potential of zero a typical retarding voltage would be $-3$ V with the collector currents almost equal. Any capacitative feed through of the signal between grids 22 and 24 is compensated by a capacitor 60 and inverting amplifier 62 connected in series between the grids.

This measurement arrangement automatically compensates for any drift in the incident beam current and reduces errors arising from changes in the secondary yield at the specimen which may result from changes in topography or composition. For an instantaneous measurement during which all current values may be assumed to remain stable the comparison current is disconnected and a variable external bias is applied to the output connection 58.

As a further measure to reduce capacitative interaction between the collection circuits and the retardation bias circuit, an additional grid can be placed between the grids 22 and 24 or 22 and 20 and connected to earth. It is also believed that the problem of interaction may be reduced if the current to grid 20, instead of the current to grid 24, is used as the reference level by exchanging the connections to those grids.

The planar grid geometry of the analyzer according to the invention has provided advantages in the use of the limited space available in the SEM and has enabled good electrical stability to be achieved. Thus with beam currents of only $10^{-11}$ A, potential variations in the order of tens of millivolts have been resolved in a measurement band width of 10 Hz. A further improved measurement capability is possible by mounting a channel plate electron multiplier at the input face of grid 20. The plate would be of similar dimensions to the analyzer element and the combined assembly could be less than 20 mm thick. The consequent increase in signal level enables the measurement band width to be extended into the KiloHertz range.

I claim:

1. Apparatus for electrostatic energy analysis in an electron-beam probe instrument having means for mounting a specimen in a predetermined plane, the apparatus comprising:

a retarding-field analyzer element having at least three similar plane grids superimposed in parallel planes, each grid being pierced to enable an electron beam to pass unobstructed through the element on a common axis perpendicular to the plane of each grid and having independent means for external electrical connection;

means for maintaining equal the capacitance between adjacent grids including means for maintaining the spacings between adjacent grids substantially similar; and means enabling the element to be rigidly mounted at a predetermined position spaced apart from the specimen mounting plane of the instrument such that the common axis is coincident with the beam axis of the instrument.

2. Apparatus according to claim 1 in which the element carries a channel plate electron multiplier adjacent to that face of the element which is arranged in use to confront the specimen mounting plane.

3. An electron-beam probe instrument comprising means for producing a focused axial electron beam, mounting means to enable a desired region of a specimen to be exposed to the electron beam at a focus whereby secondary electrons are produced, and a retarding field analyzer element in accordance with claim 1 disposed so that the common axis is coincident with the axis of the electron beam, the predetermined position being such as to enable the collection of the secondary electrons by the element for the energy distribution analysis of such electrons.

4. An instrument according to claim 3 including electrode means at least partially surrounding the space between the specimen mounting plane and the element and effective when maintained at a suitable electric potential to increase the probability of collection of the secondary electrons by the element.

5. An instrument according to claim 3 comprising:

means for applying potentials to the grids of the analyzer element, the grids being numbered in order of decreasing proximity to the specimen, and the potentials being of such value and sign that secondary electrons of energy below a value determined in relation to the potential of the second grid are collected by the first grid and those of energy above that value are collected by the third grid;

means for sensing the resultant currents in the first and third grid circuits; and means for varying the second grid potential such that the ratio of the currents is maintained at a constant value.

6. An instrument according to claim 3 in which the analyzer element includes a further grid lying on that side of the third grid remote from the specimen, means being provided for maintaining the further grid at a negative potential effective to prevent secondary electrons from entering the analyzer element from the portion of the instrument column remote from the specimen.

7. An instrument according to claim 3 including means responsive to electrons back scattered from the specimen and transmitted by the analyzer element to enable an image of the specimen to be derived.

* * * * *